(12) United States Patent
Wald et al.

(10) Patent No.: US 7,446,677 B2
(45) Date of Patent: Nov. 4, 2008

(54) METHOD AND APPARATUS FOR OPTICALLY DETECTING SELECTIONS MADE ON AN INPUT DEVICE

(75) Inventors: Steven F. Wald, Meridian, ID (US); Michael David Cusack, Boise, ID (US)

(73) Assignee: Avago Technologies ECBU IP Pte Ltd, Singapore (SG)

( * ) Notice: Subject to any disclaimer, the term of this patent is extended or adjusted under 35 U.S.C. 154(b) by 346 days.

(21) Appl. No.: 11/273,033

(22) Filed: Nov. 14, 2005

(65) Prior Publication Data

US 2007/0109152 A1    May 17, 2007

(51) Int. Cl.
*H03M 11/00* (2006.01)

(52) U.S. Cl. .......................... 341/31; 345/168; 340/22; 340/20; 400/477; 250/22.9

(58) Field of Classification Search .................... 341/20, 341/22, 31; 345/108, 163, 165, 166; 400/477; 250/229

See application file for complete search history.

(56) References Cited

U.S. PATENT DOCUMENTS

| | | | | |
|---|---|---|---|---|
| 3,603,982 A | * | 9/1971 | Patti ............................. 341/31 |
| 3,697,762 A | * | 10/1972 | Kurtz .......................... 250/239 |
| 3,787,837 A | * | 1/1974 | Allen et al. ..................... 341/31 |
| 4,159,183 A | * | 6/1979 | Johannsen ................... 400/477 |
| 4,379,968 A | * | 4/1983 | Ely et al. ..................... 250/229 |
| 4,417,824 A | * | 11/1983 | Paterson et al. ............. 400/477 |
| 4,641,026 A | * | 2/1987 | Garcia, Jr. ................... 250/229 |
| 4,868,568 A | * | 9/1989 | Souloumiac ................. 341/31 |
| 4,931,794 A | * | 6/1990 | Haag et al. ..................... 341/31 |
| 5,034,602 A | * | 7/1991 | Garcia et al. ............ 250/227.22 |
| 7,166,831 B2 | * | 1/2007 | Depue et al. ................. 250/221 |

* cited by examiner

*Primary Examiner*—Albert K. Wong

(57) ABSTRACT

Optics are utilized in an input device such as a mouse or keyboard, for example, to detect a condition of one or more selection indicators, such as whether a key or button has been depressed or a scroll wheel has been rotated. Depressing a key, clicking a button and/or rotating a scroll wheel cause one or more optical signals to be reflected from the corresponding selection indicator onto an optical detector. The optical detector generates electrical signals in response to the light received by the optical detector. A computational device of the input device processes the electrical signals to determine whether a key or button has been depressed, whether a scroll wheel has been rotated, etc. The corresponding information is then input to a computer that is interfaced with the input device.

12 Claims, 7 Drawing Sheets

METHOD AND APPARATUS FOR OPTICALLY DETECTING SELECTIONS MADE ON AN INPUT DEVICE

BACKGROUND OF THE INVENTION

Computer Input devices such as mice and keyboards are used to enable users to generate input data that is input to the computer in a form that the computer recognizes. A standard keyboard has an array of electromechanical switches that are actuated by pressing the keys over them. The electrical switches are connected by a circuit board to a microcontroller or some other interface device that recognizes the outputs of the switches as corresponding to particular keys on the keyboard. The microcontroller provides the computer with a digital number that corresponds to the key that was pressed.

Some of the disadvantages of the standard keyboard are that they consume a relatively large amount of space, and the electrical circuitry is relatively expensive due to the large number of electrical switches for the keys. Also, the array of keys is physically fixed to the circuit board, which further limits the flexibility of the keyboard. In addition, the electrical key switches are not very reliable, and the keyboard is susceptible to damage from spills and from other matter falling between the keys.

Like the standard keyboard, a typical mouse has several electromechanical switches. This is true for both track ball type mice and optical mice. Both types of mice include buttons that are depressed in order to cause some type of action to be performed. An electromechanical switch below the button is actuated when the button is pressed, or "clicked". Actuation of the electromechanical switch produces an electrical signal having a value that depends on the button that was pressed. This signal is received by a microcontroller that interprets the signal as corresponding to one of the buttons being clicked. The microcontroller then inputs a corresponding electrical signal to the computer.

Like the standard keyboard, the electromechanical switches of the mice tend to be unreliable and relatively expensive. Accordingly, a need exists for an input device that does not require the use of electromechanical switches, and that is more reliable and cost-effective than existing input devices.

SUMMARY OF THE INVENTION

The invention provides a method for optically detecting selections made on an input device. The apparatus comprises an input device comprising a light source, an optical assembly, an optical detector, and a computational device. The light source projects light onto one or more selection indicators of the input device. The optical assembly receives light reflected from the selection indicators and directs the received light onto an optical detector. The optical detector receives light directed onto it by the optical assembly and produces one or more electrical signals in response to receiving the light. The computational device receives the electrical signals and processes the electrical signals to determine a condition of said one or more selection indicators.

The method comprises illuminating one or more selection indicators of the input device with light produced by a light source, directing light reflected from reflective surfaces of the selection indicators onto an optical detector, which produces electrical signals in response to receiving the reflected light, and processing the electrical signals produced by the optical detector in a computational device to determine a condition of the selection indicators.

In accordance with one embodiment, the input device is a keyboard and the selection indicators are keys of the keyboard. In accordance with another embodiment, the input device is a mouse and the selection indicators are the mouse buttons and the scroll wheel.

These and other features and advantages of the invention will become apparent from the following description, drawings and claims.

DETAILED DESCRIPTION OF THE PREFERRED EMBODIMENT

The invention utilizes optics in an input device such as a mouse or keyboard, for example, to detect a condition of one or more selection indicators, such as whether a key or button has been depressed or a scroll wheel has been rotated. Depressing a key, clicking a button and/or rotating a scroll wheel cause one or more optical signals to be reflected from the selection indicator onto an optical detector. The optical detector generates electrical signals in response to the light received by the optical detector. A computational device of the input device processes the electrical signals to determine whether a key or button has been depressed, whether a scroll wheel has been rotated, etc. The corresponding information is then input to a computer that is interfaced with the input device.

Figure 1B:
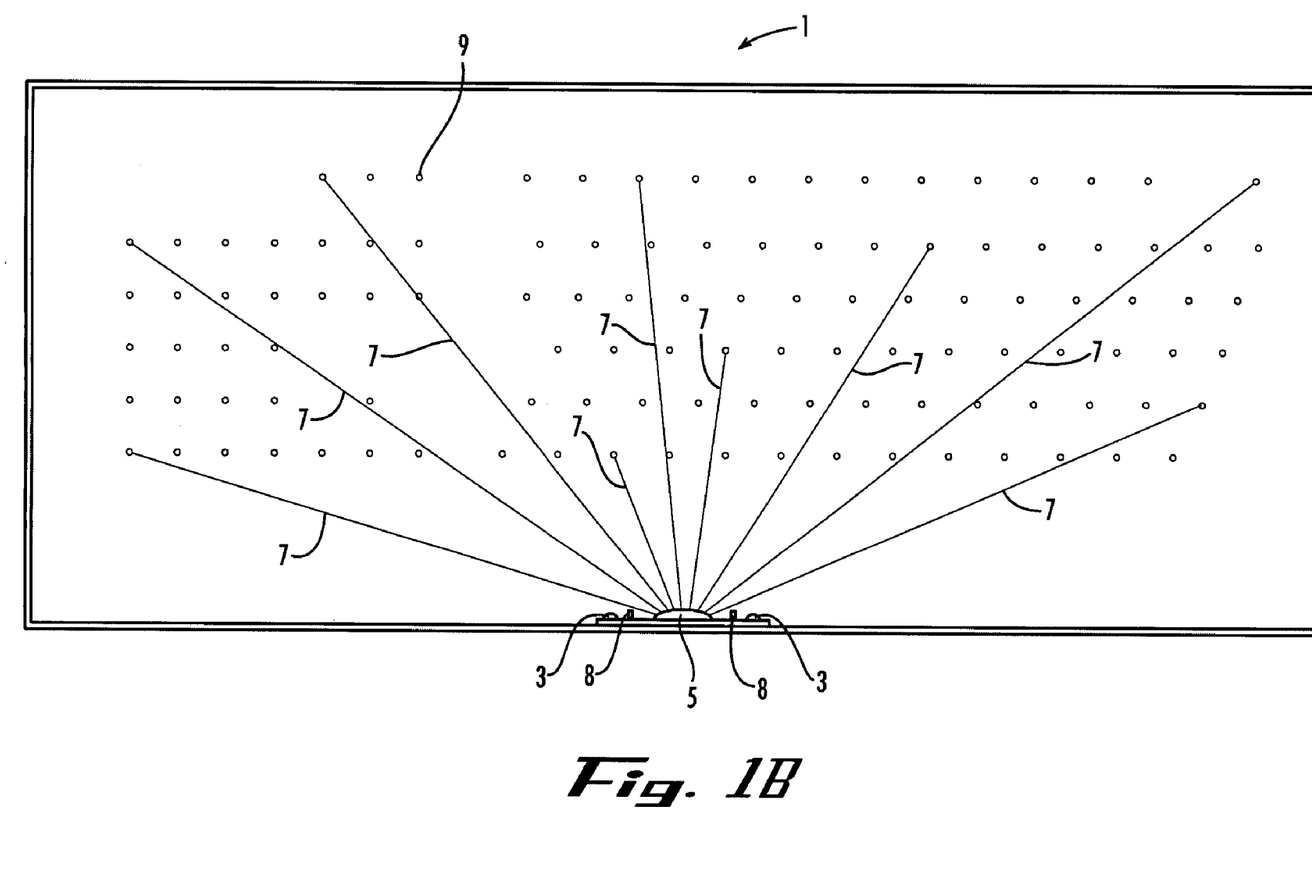
FIGS. 1A and 1B illustrates a side view and bottom view, respectively, of a keyboard in accordance with an exemplary embodiment of the invention.
Figure 1H:
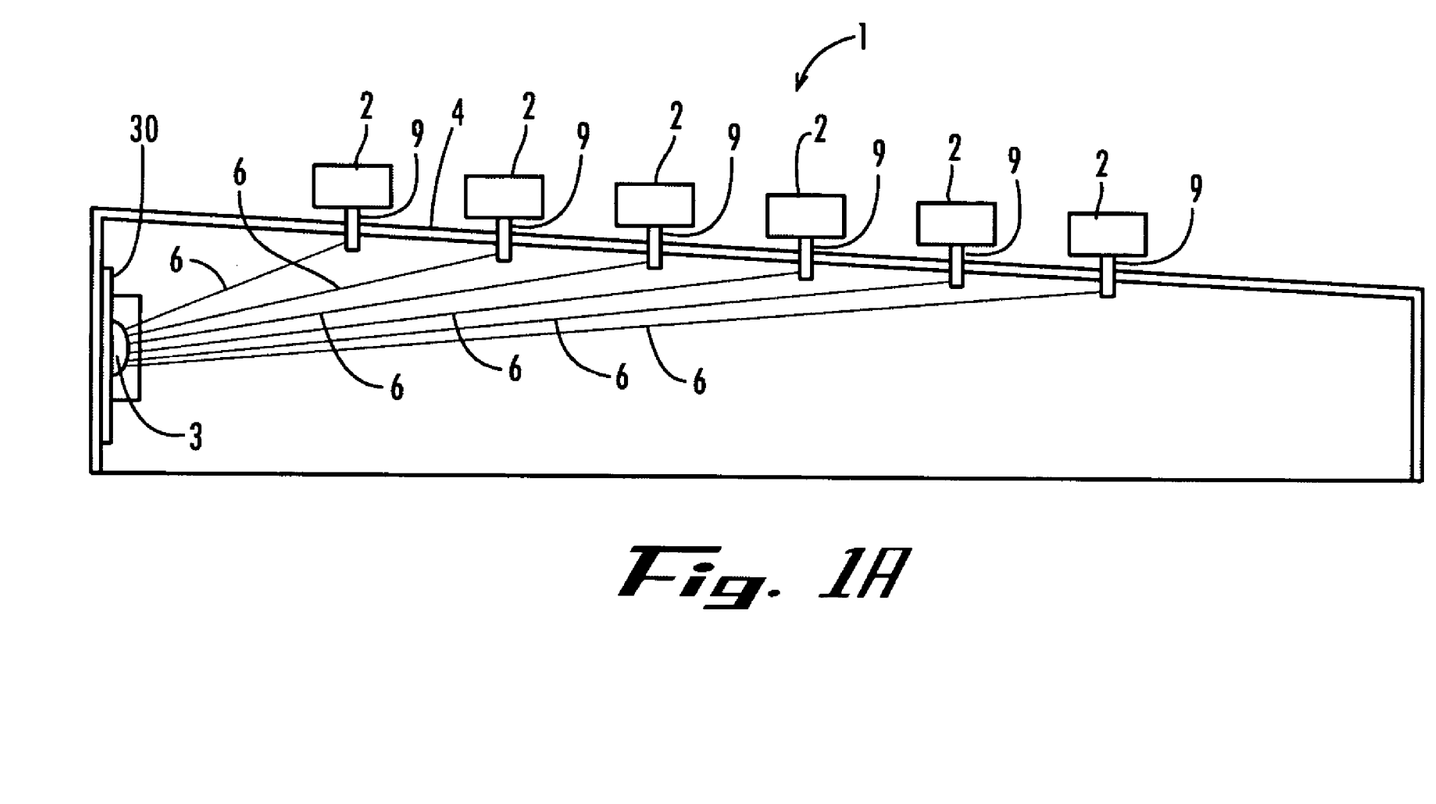

FIGS. 1A and 1B illustrate a side view and a bottom view, respectively, of a keyboard 1 in accordance with an exemplary embodiment of the invention. With reference to the side view of the keyboard 1 shown in FIG. 1A, the keyboard 1 has keys 2 that may be the same or similar to keys of a standard keyboard in that when they are depressed, they are biased by biasing mechanisms (not shown), such as springs, for example, back to their original non-depressed positions. As described in more detail below with reference to FIGS. 2A and 2B, in accordance with this exemplary embodiment, each key 2 includes a protrusion 9 that extends a first distance $d_1$ below the top surface 4 of the keyboard 1 when the key is not depressed, and extends a second distance $d_2$ below the top surface 4 when the key is in its depressed position. The distance $d_2$ is greater than the distance $d_1$. The distance $d_1$ may be zero, creating a flush appearance with the keyboard surface 4 that will contrast with the appearance of a depressed key's protrusion 9. One or more light sources 3 illuminate the protrusion 9 of each key 2 from underneath, inside the keyboard assembly. The lines 6 shown in FIG. 1A represent rays of light produced by the light source 3 that impinge on the protrusions 9 of the keys 2.

With reference to the bottom view of the keyboard 1 shown in FIG. 1B, an optical imager 5 detects optical energy that impinges thereon and converts the optical energy into electrical signals. The optical imager 5 is shown as a wide-angle lens positioned above a detector to provide a relatively wide-angle view of the protrusions 9 of the keys 2 (FIG. 1A) of the keyboard 1. The lens and detector of the imager 5 are described below in detail with reference to FIGS. 4A and 4B. The lens and detector of the imager 5 are configured such that the location at which light impinges on the detector is different for each of the different keys, and for each key, is different depending on whether the key is in the depressed or non-depressed position. The lines 7 shown in FIG. 1B represent rays of light reflected from the protrusions 9 of the keys 2 onto the optical imager 5. Opaque stops 8 prevent light emanating from the light sources 3 from being directly incident on the optical imager 5, as described in more detail below with reference to FIGS. 4A and 4B.

The detector of the optical imager 5 converts the optical energy that impinges thereon into electrical signals that represent whether a key is in the depressed position or non-depressed position. A microcontroller (not shown) processes the electrical signals and determines which, if any, keys are in the depressed or non-depressed positions, and then passes the corresponding information to the computer (not shown) to which the keyboard is interfaced. The light sources 3, the optical imager 4, the stops 8 and the microcontroller are mounted on a circuit board 30, as described below in detail with reference to FIGS. 4A and 4B.

Figure 2A:
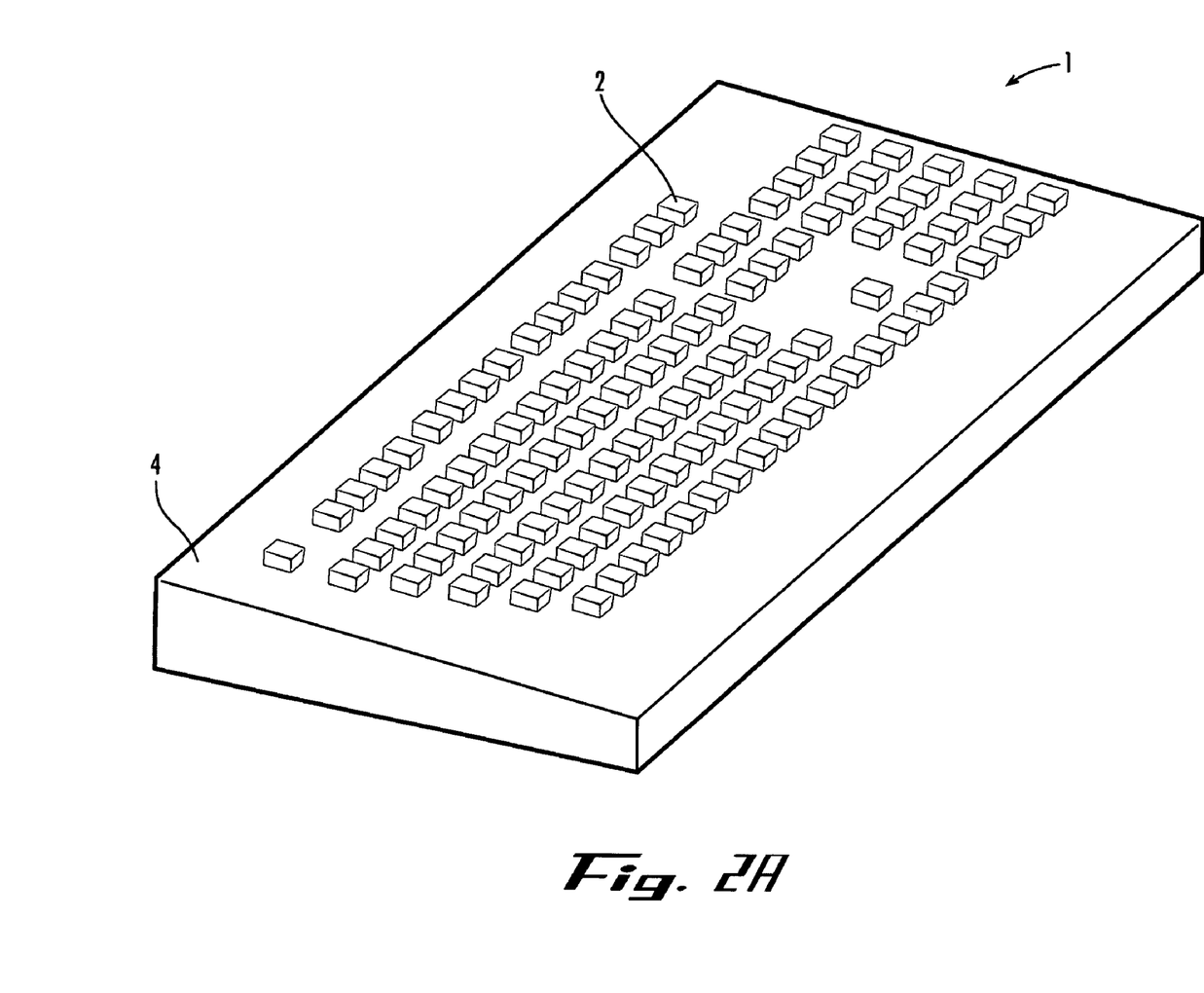
FIGS. 2A and 2B illustrate a top perspective view and a bottom perspective view, respectively, of the keyboard shown in FIGS. 1A and 1B.
Figures 2B, 3:
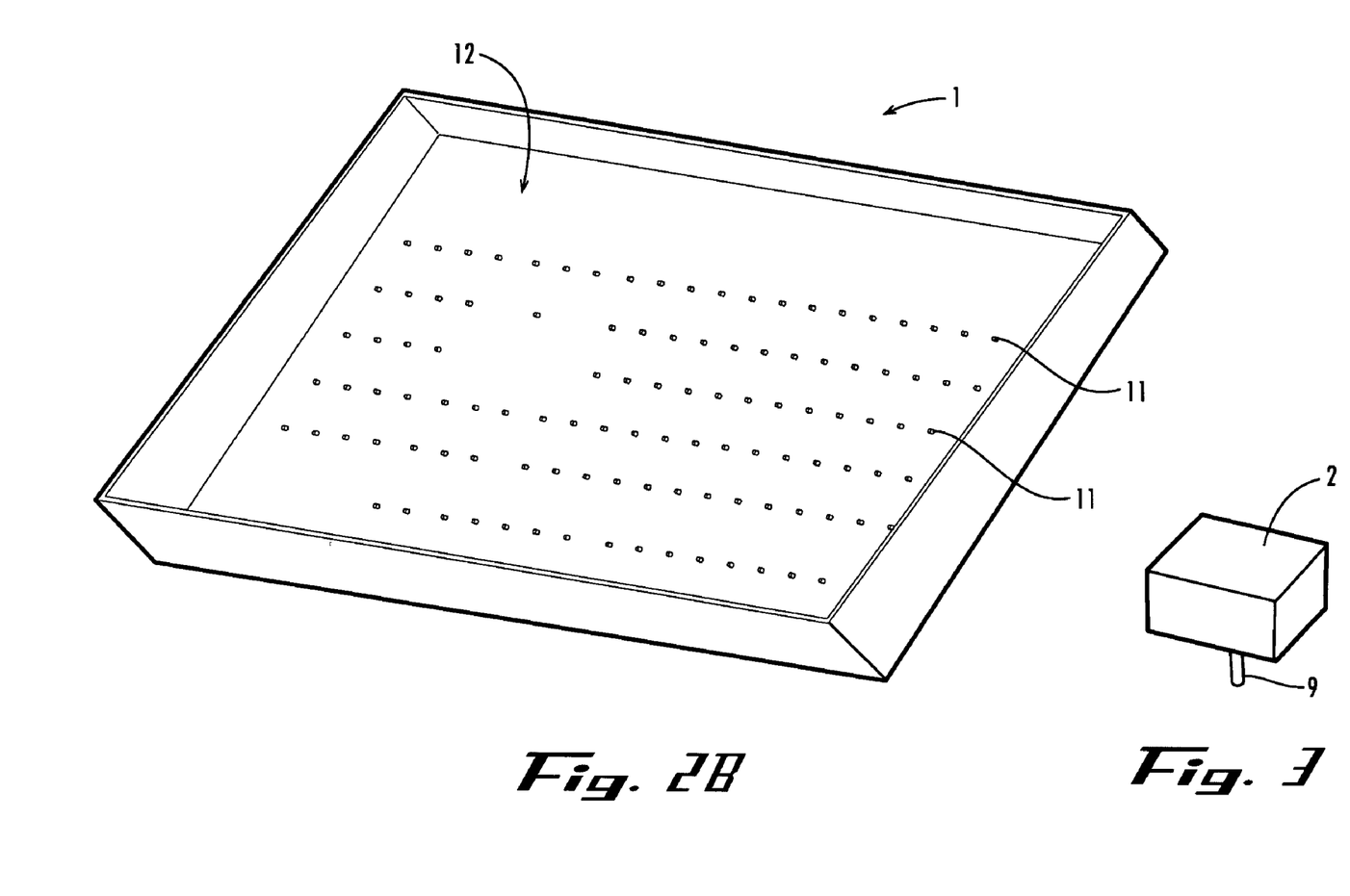
FIG. 3 illustrates a perspective view of one of the keys shown in FIGS. 2A and 2B, which shows the protrusion, or peg, that passes through an opening below the position of the key.

FIGS. 2A and 2B illustrate a top perspective view and a bottom perspective view, respectively, of the keyboard 1. The top perspective view looks essentially the same as a top perspective view of a standard keyboard. However, the bottom perspective view shows tiny openings 11 at the locations of the keys. The aforementioned protrusions 9 of the keys 2 pass through these openings.

FIG. 3 illustrates a perspective view of one of the keys 2, which shows the protrusion 9 that passes through opening 11 below the position of the key 2. In accordance with this exemplary embodiment, the protrusion 9 is generally pin-shaped. When the key 2 is in its depressed position, the protrusion 9 extends a distance $d_2$ into the space 12 (FIG. 2B) below the top surface 4 of the keyboard 1. When the key 2 is in its non-depressed position, the protrusion 9 extends a distance $d_1$ into the space 12 below the top surface 4 of the keyboard. It should be noted that the protrusion 9 is only one example of a suitable reflective surface located on the underside of the keys for reflecting light. A variety of other shapes or surfaces may be provided on the keys for this purpose.

As stated above, the optical images that the protrusions 9 project onto the optical imager 5 vary depending on whether the keys are in the depressed or non-depressed positions. Consequently, the electrical signals that are output from the optical imager 5 will vary depending on which keys are depressed and which keys are not depressed, thereby allowing a determination to be made as to when any key is in the non-depressed position and when any key is in the depressed position, as well as which of all the keys is depressed.

Figure 4A:
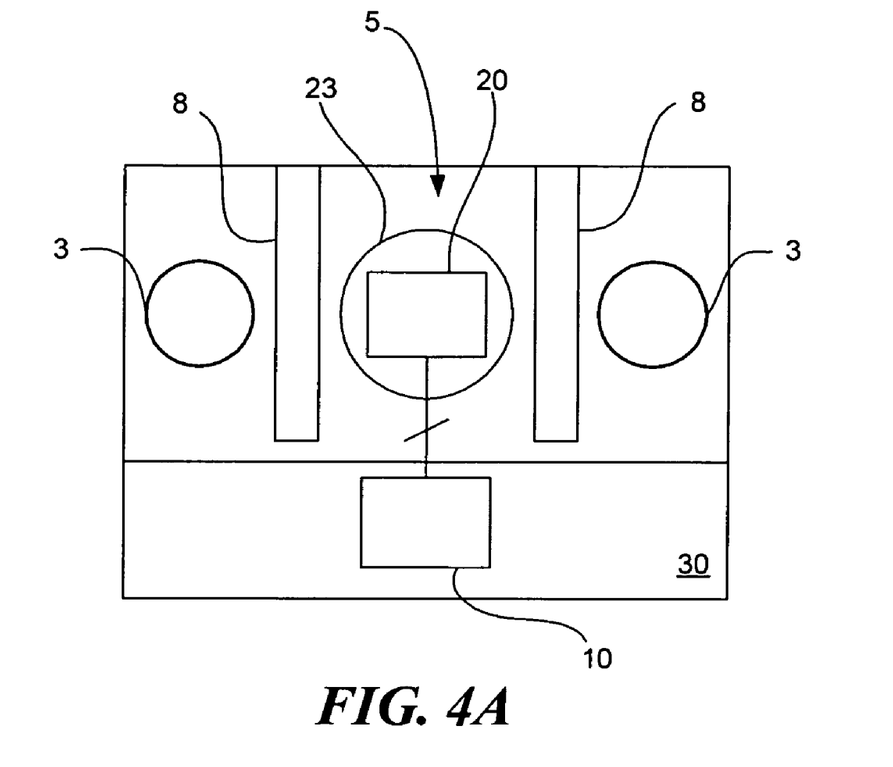
FIG. 4A illustrates a plan view of an exemplary embodiment of the circuit board on which the optical and electrical components of the keyboard shown in FIGS. 1A-2B are mounted.

FIG. 4A illustrates a plan view of an exemplary embodiment of the circuit board 30 on which the optical and electrical components of the invention are mounted. Two light sources 3 are mounted on opposite sides of the circuit board 30. An optical detector 20 of the optical imager 5 is mounted beneath a wide-angle lens 23 of the optical imager 5. The lens 23 focuses light reflected from the protrusions 9 of the keys 2 onto the detector 20. Walls 8 disposed on opposite sides of the optical imager 5 block direct light from the light sources 3 from impinging on the detector 20 such that direct light from the light sources 3 will not interfere with images of protrusions 9 formed on the detector 21. The detector 20 generates electrical multi-bit digital signals that are output to a microcontroller 10. The microcontroller 10 processes the digital signals and identifies keys that are depressed based on the digital signals.

Figure 4B:
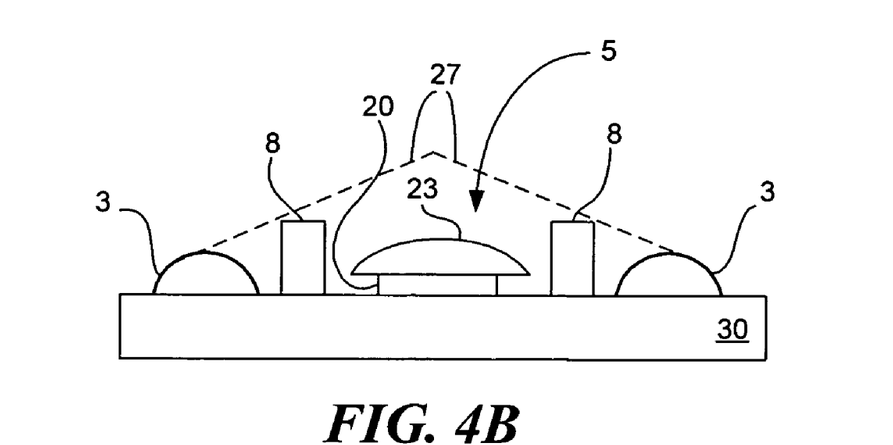
FIG. 4B illustrates a side view of the circuit board shown in FIG. 4A.

FIG. 4B illustrates a side view of the circuit board 30 shown in FIG. 4A. The dashed lines 27 represent rays of light produced by the light sources 3, and demonstrate the manner in which the walls 8 prevent light produced by the light sources 3 from impinging directly on the detector 20.

It should also be noted that, although it is preferable to use multiple light sources to ensure adequate illumination of the keys, as demonstrated in FIGS. 1A-4B, it is not necessary to use multiple light sources. A single light source may be sufficient. Also, the invention is not limited with respect to the locations at which the components shown in FIGS. 4A and 4B are mounted.

Figure 5:
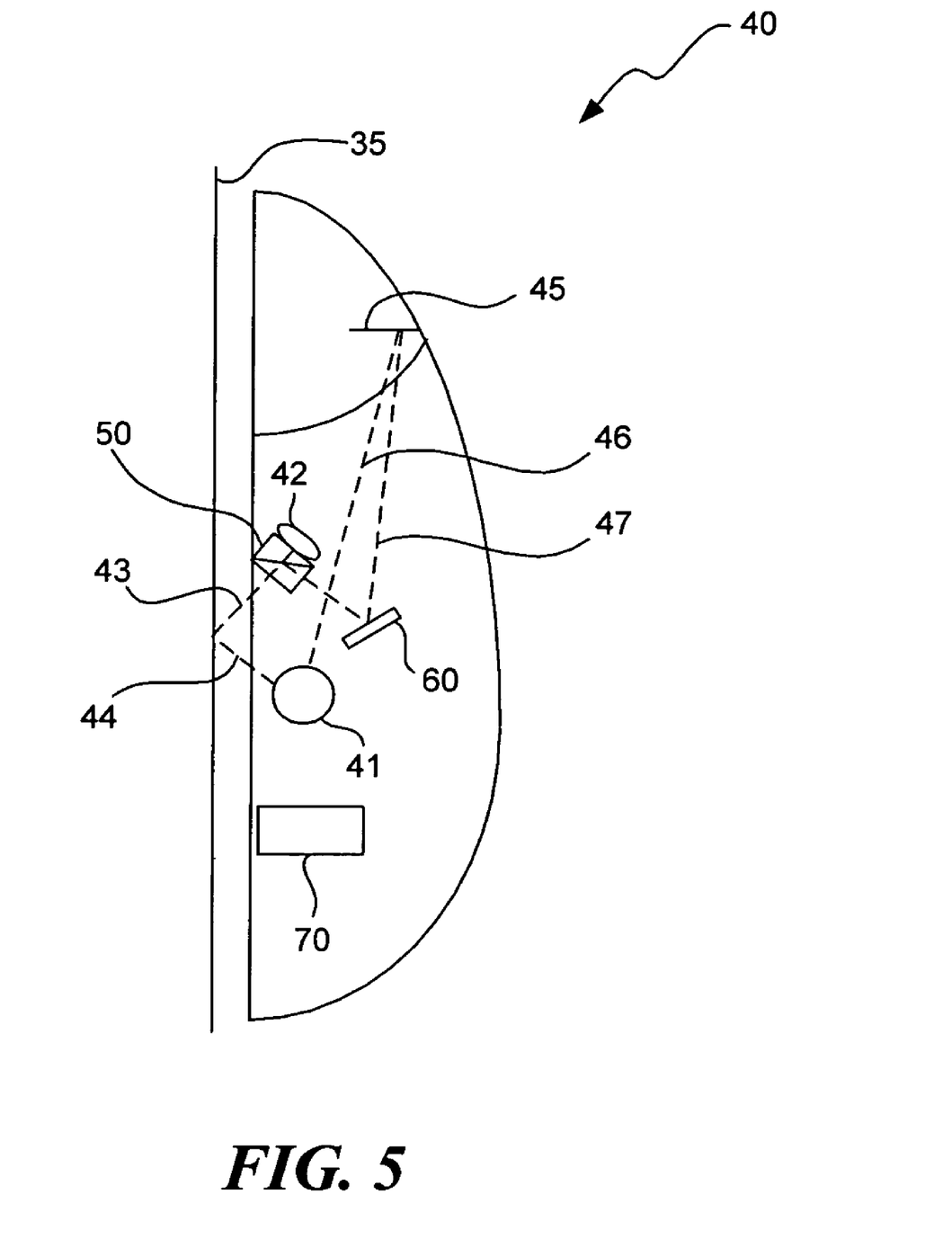
FIG. 5 illustrates a vertical side view of an optical mouse in accordance with an exemplary embodiment of the invention.

FIG. 5 illustrates a vertical side view of an optical mouse in accordance with an exemplary embodiment of the invention. In accordance with this embodiment, a standard optical mouse is configured such that the same optical components (i.e., light source and detector) that are used to detect movement of the mouse on a surface are also used to detect when a button has been clicked and when and to what degree the scroll wheel has been turned. This enables the circuitry associated with the buttons and the scroll wheel to be eliminated, thereby decreasing part count and costs associated with the mouse.

The mouse 40 shown in FIG. 5 has a light source 41, which is typically a light emitting diode (LED) 41. The light source 41 projects light, which impinges on a tracking surface 35 on which the mouse is being moved by a user (not shown). Light reflected from the surface passes through a combiner 50 and impinges on an optical detector 42, which is typically a photodetector that converts optical energy into electrical signals. The path of the light projected onto and reflected from the surface 35 is represented by dashed lines 43 and 44. The electrical signals produced by the optical detector 42 are converted into digital signals, either by the detector 42 or by an analog-to-digital converter (not shown). The digital signals are then processed by a microcontroller 70 of the mouse in the normal fashion to determine movement of the mouse 40.

The arrangement of the light source 41 and the optical detector 42 are known and are commonly used in standard optical mice, although the arrangement of these components within the mouse may vary depending on the manufacturer. In accordance with the invention, the combination of the light source 41 and optical detector 42 are also used to detect when the left or right button on the mouse 40 has been clicked. For ease of illustration, and because the lower surfaces of the buttons can take on a variety of shapes, the buttons are represented in FIG. 5 by a single surface 45. Also, the scroll wheel is not shown in FIG. 5 in order to allow the light paths 46 and 47 associated with the buttons to be easily seen. The scroll wheel is described below with reference to FIG. 6.

The path of the light projected onto and reflected from the surface 45 is represented by dashed lines 46 and 47, respectively. A reflective surface 60, such as a mirror, reflects the light 47 received thereby to the optical combiner 50. The optical combiner 50 combines the light reflected from the surface 35 with the light reflected from reflective surface 60 in such a way that the combined light impinges on optical detector 42. The combined light causes the optical detector 42 to produce electrical signals that indicate not only movement of the mouse on the tracking surface 35, but also whether the light and/or right mouse buttons have been depressed. The microcontroller (not shown) of the mouse interprets these electrical signals and inputs corresponding electrical digital signals to an I/O port of the computer to which the mouse 40 is interfaced.

Figure 6:
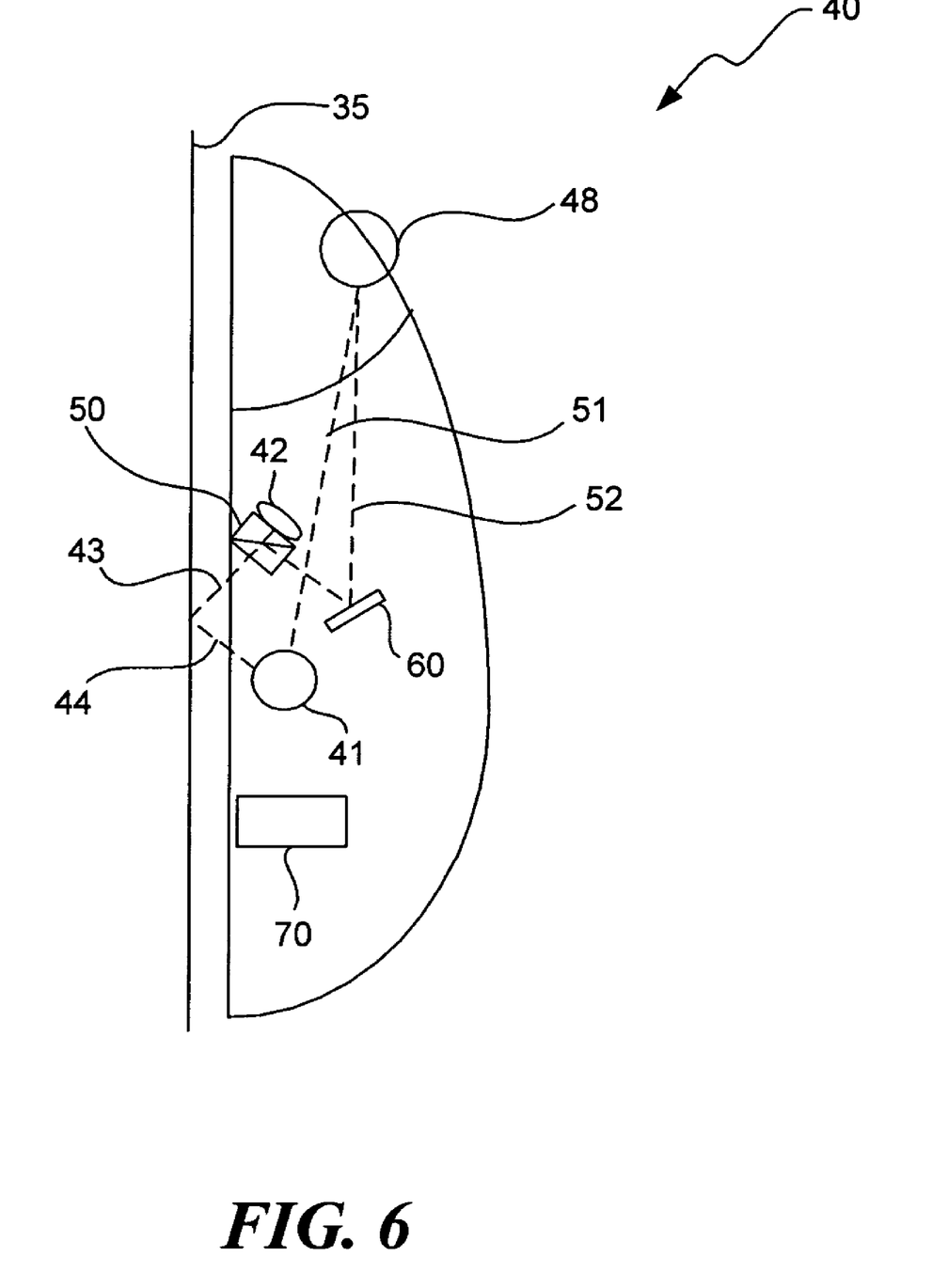
FIG. 6 illustrates a vertical side view of an optical mouse in accordance with another exemplary embodiment of the invention.

As stated above, in accordance with the preferred embodiment, the combination of the light source and optical detector is used to project light onto the tracking surface the button lower surfaces and the scroll wheel, and to detect movement along the tracking surface, depression of the left and right mouse buttons, and the position of the scroll wheel. The scroll wheel 48 is shown in FIG. 6. In a standard optical mouse, the scroll wheel is connected to a disk that has holes around its periphery. A light source (not shown) and optical detector (not shown) that are separate from the light source 41 and detector 42 are used to determine movement of the disk. Generally, light is projected onto the disk such that it passes through the holes formed in the periphery of the disk. The optical detector detects changes in the light and dark patterns created on the detector by movement of the disk. The microcontroller of the mouse translates these patterns into a degree and direction of movement of the disk.

As shown in FIG. 6, light from the light source 41 illuminates the scroll wheel 48. The light from the light source 41 to the scroll wheel is represented by dashed line 51. The scroll wheel does not have holes formed in it through which light passes, but instead has a reflective surface that reflects light. The surface of the scroll wheel 48 may be patterned in a unique way in order for the imager to easily distinguish between its motion and the motion of the surface 35 on which the mouse rests. The path of the light reflected by the surface of the scroll wheel 48 is represented by dashed line 52. The reflected light is then reflected by reflective surface 60 to combiner 50, which combines the light with light reflected from the tracking surface 35 and light reflected from the scroll wheel 48 and from the button surface 45 shown in FIG. 5. The combined light impinges on optical detector 42, which produces an electrical signal in response to the optical energy impinging thereon. The microcontroller 70 translates this electrical signal into an indication of movement of the mouse 40 over the tracking surface 35, whether the left and/or right mouse button 45 is depressed, and a degree and direction of movement of the scroll wheel 48.

It should be noted that it is not necessary that the same light source and detector be used for all three of these functions, but it is preferable because doing so maximizes the reduction in part count and the costs associated with the mouse 40. It should also be noted that the complexity of the optical paths may be such that other reflective surfaces and/or lenses may be incorporated into the mouse. This is also true with respect to the keyboard described above with reference to FIGS. 1A-4B. Any optical assembly may be used for these purposes. Also, although a microcontroller has been described as being used with the keyboard shown in FIGS. 1A-4B, and with the mouse shown in FIGS. 5 and 6, any computational device may be used for this purpose, such as a microprocessor, an application specific integrated circuit (ASIC), etc. Also, the computational device may be implemented solely in hardware or in a combination of hardware and software.

It should be noted that the invention has been described with reference to preferred and exemplary embodiments and that the invention is not limited to these embodiments. Those skilled in the art will understand that modifications may be made to the embodiments described herein and that all such modifications are within the scope of the invention.

What is claimed is:

1. An input device for inputting data to a computer, the input device comprising:
    a light source that projects light onto a plurality of selection indicators of the input device, each selection indicator capable of reflecting light in an angular direction uniquely associated with it;
    optics that receive light reflected from said plurality of selection indicators and direct the received light;
    an optical detector that receives light directed onto the optical detector by the optics, the light impinging upon the optical detector from an angular direction uniquely associated with the selection indicator from which the light is reflected, the optical detector producing one or more electrical signals in response to receiving the light; and
    a computational device that receives the electrical signals and processes the electrical signals to determine from which of the selection indicators the light is reflected based upon the angular direction from which the optical detector receives the light.

2. The input device of claim 1, wherein the input device is a keyboard and said one or more selection indicators correspond to one or more respective keys of the keyboard, and wherein each key is capable of reflecting light in an angular direction uniquely corresponding to a location of the key in the keyboard, and wherein whether or not light is reflected from one of the keys in its associated angular direction corresponds to whether or not said key is in a depressed position or a non-depressed position.

3. The input device of claim 2, wherein the light source, optical assembly, optical detector, and computational device are located within the keyboard at locations beneath the keys, and wherein each key has a bottom reflective surface on an underside of the key that is within a field of view of the optics, and wherein the optics focus light reflected from the bottom reflective surfaces of the keys onto the optical detector.

4. A method for determining if one or more selection indicators of an input device have been selected, the method comprising:
    illuminating a plurality of selection indicators of the input device with light produced by a light source, each selection indicator having a reflective surface capable of reflecting light in an angular direction uniquely associated with it;
    directing light reflected from reflective surfaces of the selection indicators onto an optical detector, the light being directed by optics onto the optical detector, the light impinging upon the optical detector from an angular direction uniquely associated with the selection indicator from which the light is reflected, the optical detector producing electrical signals in response to receiving the reflected light; and
    processing the electrical signals produced by the optical detector in a computational device to determine from which of said one or more selection indicators the light is reflected based upon the angular direction from which the optical detector receives the reflected light.

5. The method of claim 4, wherein the input device is a keyboard and said one or more selection indicators correspond to one or more respective keys of the keyboard, and wherein each key is capable of reflecting light in an angular direction uniquely corresponding to a location of the key in the keyboard, and wherein whether or not light is reflected from one of the keys in its associated angular direction corresponds to whether said key is in a depressed position or a non-depressed position.

6. The method of claim 5, wherein the light source, optical assembly, optical detector, and computational device are located within the keyboard at locations beneath the keys, and wherein each key has a bottom reflective surface on an underside of the key that is within a field of view of the optical assembly, and wherein the optics focus light reflected from the bottom reflective surfaces of the keys onto the optical detector.

7. The method of claim 4, wherein the input device is an optical mouse, said surface is a reflective surface over which said optical mouse can be moved, and said one or more selection indicators include one or more respective buttons on the mouse, wherein said condition corresponds to whether or not one or more of said buttons are in a depressed position or a non-depressed position.

8. The method of claim 7, wherein light reflected from each of a plurality of buttons is focused by the optics in an angular direction uniquely associated with it onto a correspondingly uniquely associated location on the optical detector, and wherein the electrical signals received by the computational device from the optical detector include information relating to locations on the optical detector onto which light was directed by the optics, the computational device using the location information to determine which of the plurality of buttons is in a depressed position and which of the plurality of buttons is in a non-depressed position.

9. An input device for inputting positional information and selection information to a computer, the input device comprising:
   a housing;
   one or more selection indicators mounted in the housing;
   a light source in the housing, both a surface and one or more of the selection indicators receiving light produced by the light source, both the surface and one or more of the selection indicators capable of reflecting the light impinging upon them, one of the surface and the housing movable with respect to the other to indicate the positional information;
   an optical combiner, the optical combiner combining light reflected from one or more of the selection indicators with light reflected from the surface;
   optics that combine light impinging upon or reflected from the surface with light impinging upon or reflected from one or more of the selection indicators;
   an optical detector that receives light impinging upon or reflected from the surface and light impinging upon or reflected from one or more of the selection indicators, the optical detector producing one or more electrical signals in response to receiving the light; and
   a computational device that receives the electrical signals and processes the electrical signals to determine:
      a position of the surface and the housing relative to one another; and
      whether or not the light is reflected from a selection indicator and thereby to determine a condition of each selection indicator.

10. The input device of claim 9, wherein the input device is an optical mouse, said surface is a reflective surface over which said optical mouse can be moved, and said one or more selection indicators include one or more respective buttons on the mouse, wherein said condition corresponds to whether or not one or more of said buttons are in a depressed position or a non-depressed position.

11. The input device of claim 10, wherein light reflected from each of a plurality of buttons is focused by the optics in an angular direction uniquely associated with it onto a correspondingly uniquely associated location on the optical detector, and wherein the electrical signals received by the computational device from the optical detector include information relating to locations on the optical detector onto which light was directed by the optics, the computational device using the location information to determine which of the plurality of buttons is in a depressed position and which of the plurality of buttons is in a non-depressed position.

12. The input device of claim 9, wherein said surface is a reflective surface of a scroll wheel that reflects light from the light source, the optics directing light reflected from the light source onto the optical detector, the optical detector producing electrical signals in response to receiving the light reflected from the reflective surface of the scroll wheel, the computational device processing the electrical signals produced in response to the combined light to determine an amount and direction of rotation of the scroll wheel.

* * * * *